US009266260B2

(12) United States Patent
Petrzelka

(10) Patent No.: US 9,266,260 B2
(45) Date of Patent: Feb. 23, 2016

(54) PRECISION CONTINUOUS STAMP CASTING METHOD FOR ROLL-BASED SOFT LITHOGRAPHY

(71) Applicant: Massachusetts Institute of Technology, Cambridge, MA (US)

(72) Inventor: Joseph Edward Petrzelka, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 375 days.

(21) Appl. No.: 13/709,182

(22) Filed: Dec. 10, 2012

(65) Prior Publication Data

US 2013/0154152 A1     Jun. 20, 2013

Related U.S. Application Data

(60) Provisional application No. 61/577,732, filed on Dec. 20, 2011.

(51) Int. Cl.
*B29C 41/00* (2006.01)
*B29C 41/04* (2006.01)
(Continued)

(52) U.S. Cl.
CPC ............... *B29C 41/003* (2013.01); *B29C 41/04* (2013.01); *B29C 41/22* (2013.01); *B82Y 10/00* (2013.01); *B82Y 40/00* (2013.01); *G03F 7/0002* (2013.01); *B29K 2083/00* (2013.01)

(58) Field of Classification Search
CPC ...... B29C 41/003; B29C 41/04; B29C 41/22; B29C 41/045; B29C 47/24; B29C 47/0026; B29C 41/06; B29C 45/5605; B29C 35/0805; B29C 33/3842; B29C 67/0085; B29C 43/021; B29C 39/08; B29K 2083/00; B33Y 10/00; B33Y 30/00

USPC ............. 264/219, 2.1, 8, 503, 310, 312, 225, 264/400, 409, 482, 496, 494; 425/174.4, 425/195, 196, 470
See application file for complete search history.

(56) References Cited

U.S. PATENT DOCUMENTS 6,656,308 B2   12/2003   Hougham
6,783,717 B2    8/2004   Hougham
(Continued)

FOREIGN PATENT DOCUMENTS

JP         2007130972 A   *   5/2007

OTHER PUBLICATIONS

Joseph E. Petrzelka ; David E. Hardt; Laser direct write system for fabricating seamless roll-to-roll lithography tools. Micromachining and Microfabrication Process Technology XVIII, 861205 (Mar. 9, 2013).*

(Continued)

*Primary Examiner* — James Sanders
*Assistant Examiner* — Leith S Shafi
(74) *Attorney, Agent, or Firm* — Sam Pasternack; MIT Technology Licensing Office

(57) ABSTRACT

Method for casting a continuous cylindrical polymer stamp. The method includes depositing a first layer of a fluid polymer on the inside of a rotatable drum and rotating the drum for a selected time and at a selected angular velocity. The polymer is cured to produce a uniform datum surface. A second layer of polymer is deposited on the first layer in the drum and the drum is rotated until solvent in the polymer has evaporated thereby forming a stable layer. The polymer is selectively exposed and developed to create a desired pattern. Thereafter, a polymer precursor is deposited on the patterned second layer and the polymer precursor is allowed to cure while the drum is rotating to produce a cured stamp. The cured stamp is removed from the drum.

7 Claims, 3 Drawing Sheets

(51) Int. Cl.
*B29C 41/22* (2006.01)
*G03F 7/00* (2006.01)
*B82Y 10/00* (2011.01)
*B82Y 40/00* (2011.01)
*B29K 83/00* (2006.01)

(56) References Cited

U.S. PATENT DOCUMENTS

| | | | |
|---|---|---|---|
| 6,981,445 B2 | 1/2006 | Cracauer | |
| 7,662,329 B2* | 2/2010 | Tomiyama et al. | 264/310 |
| 7,713,683 B2* | 5/2010 | Gray et al. | 430/322 |
| 8,585,390 B2* | 11/2013 | Tsai et al. | 425/174 |
| 2008/0044777 A1 | 2/2008 | Gary et al. | |
| 2009/0014912 A1* | 1/2009 | Ikeda et al. | 264/299 |
| 2011/0126730 A1* | 6/2011 | Berniard et al. | 101/483 |
| 2012/0015053 A1* | 1/2012 | Schmitz et al. | 424/725 |

OTHER PUBLICATIONS

JP 2007130972 A. Machine Translation.*

The International Search report and Written Opinion issued in Connection with International Patent Application No. PCT/US2012/068951 mailed on Mar. 11, 2013.

Chandekar A, Alabran M., Sengupta S., Lee J., Mead J., Barry C., Whitten J., Somu S., and Busnaina A, 2008, "Fabrication of stamps for microcontact printing by rejection molding," Microelectronic Engineering. 85(1), pp. 187-194.

Petrzelka J. E., and Hardt D. E., 2011, "Limitations on roll based microcontact printing imposed by variations in macro scale stamp dimensions," 2011 MRS Fall Meeting.

* cited by examiner

PRECISION CONTINUOUS STAMP CASTING METHOD FOR ROLL-BASED SOFT LITHOGRAPHY

This application claims priority to provisional patent application Ser. No. 61/577,732 filed on Dec. 20, 2011, the contents of which are incorporated herein by reference.

BACKGROUND OF THE INVENTION

This invention relates to continuous roll-to-roll printing of substrates for roll-based soft lithography and more particularly to a centrifugal casting method for making a cylindrical polymer stamp.

Existing stamp casting methods typically create a planar stamp. This known technique is done almost exclusively by patterning a silicon wafer, then forming a casting cavity from some combination of rigid plates and spacers. The literature has many examples of this planar technique, in which variations include casting the stamp against a foil backplane, which can be used to maintain transverse rigidity or for mounting to a magnetic roll [2-8]. The prior art planar casting method has several limitations. The uniformity of the stamp thickness is dependent on the gaps between the mold plates which can be extremely difficult, if not impossible, to maintain with submicron uniformity for larger stamps. The master surface is relegated to existing wafer platforms and is not scalable beyond wafer sizes. Wafers can be dices and tiles, but in this case discontinuities in the stamp pattern are created. There are also limitations on area and flatness. Wrapping a flat stamp around a roll presents a significant registration problem. Additionally, wrapping the flat stamp around a body of curvature results in strain at the printing interface. This strain causes pattern distortion that limits the thickness of the stamp that can be used, although ideally thicker stamps could be used to desensitize the contact interface [9]. Further, applying a flat stamp to a rigid roll results in an inherent seam. This results both in pattern discontinuity and stamp discontinuity; the latter can result in adverse dynamic performance under high speed rolling [8].

Centrifugal casting is another known prior art casting technique. In centrifugal casting, a fluid is deposited on the inner surface of a rotating drum and allowed to solidify or cure while the drum is rotating. The centripetal acceleration from the associated rotation forces the fluid into a uniform layer on the inner surface of the drum. Usually, centrifugal casting is performed with phase-change materials (i.e., molten iron for pipes or melted thermoplastics for bushings).

It is therefore an object of the present invention to provide a centrifugal casting method that eliminates pattern discontinuities (seams), produces a more dimensionally uniform stamp thickness, and can greatly reduce residual stresses and strains.

SUMMARY OF THE INVENTION

The method according to the invention for casting a continuous cylindrical polymer stamp includes depositing a first layer of fluid polymer on the inside of a rotatable drum and rotating the drum for a selected time and at a selected angular velocity. During rotation, the polymer is cured to produce a uniform datum surface. Thereafter, a second layer of polymer is deposited on the first layer in the drum and the drum is rotated until a solvent in the polymer has evaporated thereby forming a stable layer. The polymer in the second layer is selectively exposed and then developed to create a desired pattern. A polymer precursor is deposited on the patterned second layer and the polymer precursor is allowed to cure while the drum is rotating to produce a cured stamp. Thereafter, the cured stamp is removed from the drum.

In a preferred embodiment, the cured stamp is positioned on a roll using fluid pressure after which the stamp comes into direct contact with the roll. In this embodiment, the fluid polymer is photoresist. The photoresist may be selectively exposed by direct write laser, projection lithography, e-beam lithography or step and repeat nanoimprint lithography. In a preferred embodiment, the polymer precursor is polydimethylsiloxane (PDMS) precursor. The PDMS precursor may be cured by heating the drum.

The continuous casting technology disclosed herein overcomes limitations in the prior art. Because stamp uniformity is a self-stabilizing fluid dynamics problem with a reasonable time constant, achieving sub-micron thickness and uniformity is possible even if the roll or spindle is not accurate. By using a direct write system, an arbitrarily large drum surface can be patterned. There is no fundamental limit to the size of drum that can be used, resulting in a highly scalable stamp manufacturing process. When a continuous cylindrical stamp is floated onto a shaft using a thick fluid bearing layer, the stamp will approach elastic equilibrium as defined by the shape imparted by the drum. For this reason, stamps can be made quite thick (several millimeters, if desired) with no adverse effects because the stamp is in a minimum energy state when mounted on a roll. The continuous stamp process disclosed herein has no pattern or thickness discontinuity thereby allowing one to realize true steady state dynamics at high printing speeds.

DESCRIPTION OF THE PREFERRED EMBODIMENT

Figure 1:
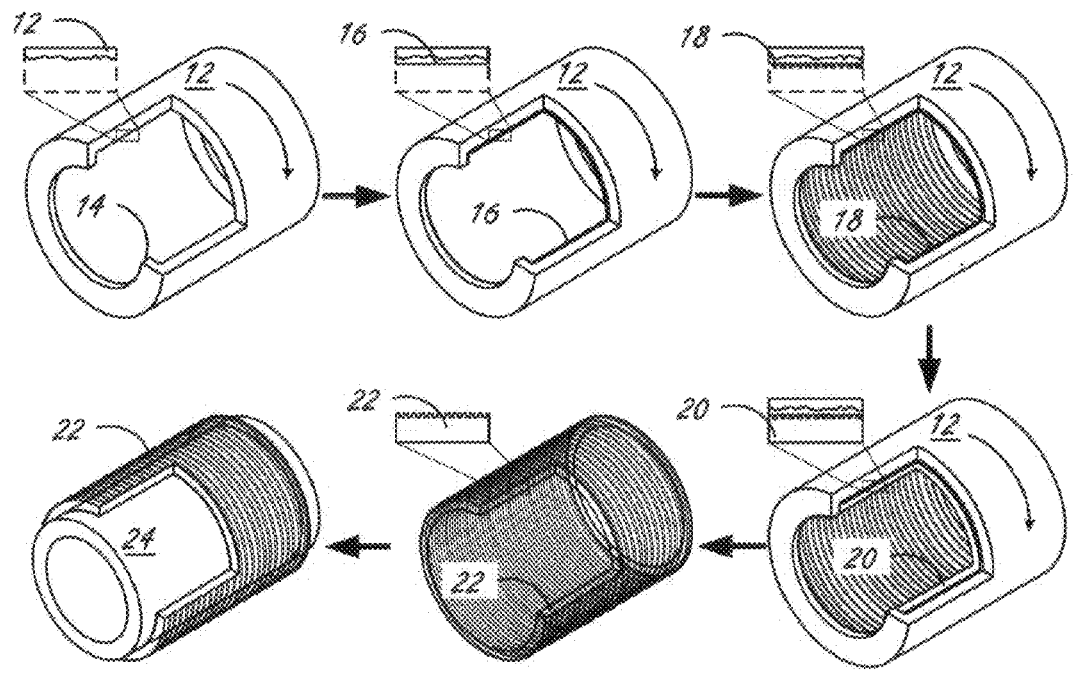
FIG. 1 is a schematic illustration of the steps of an embodiment of the method of the invention.

With reference first to FIG. 1, a centrifugal casting apparatus includes a rotating drum 12. The drum 12 includes a lip 14 for containing fluid and optionally controlling the volume of fluid contained.

In a preferred embodiment, the process of the invention is performed in the following manner. FIG. 1 illustrates the sequence of layers deposited in a centrifuge drum to form a stamp. A first layer of photoresist 16 (or other appropriate polymer) is deposited on the inner surface of the drum 12 by centrifugal casting. The entire layer of photoresist is cured; in the case of a negative photoresist, curing can be accomplished by uniform exposure. This step provides a precise and uniform datum surface regardless of the surface quality of the drum. A second layer of photoresist 18 (or other appropriate polymer) is deposited on the inner surface of the same drum also by centrifugal casting. After the photoresist solvent has evaporated and a stable layer has been formed, the rotation of the drum is stopped. The photoresist is selectively exposed, preferably by direct write laser, or by other methods such as projection lithography, e-beam lithography, or step and repeat nanoimprint lithography. After exposure, the resist is developed to create a pattern that will eventually be transferred to a stamp surface. Next, a polymer precursor 20, for example polydimethylsiloxane (PDMS) precursor, is deposited on the inner surface of the same drum. The PDMS is allowed to cure while the drum is spinning. The curing may be accelerated by heating the drum.

The cured stamp 22 is then removed from the drum. The stamp is positioned on a roll 24 using a fluid bearing, for example compressed air, or ethanol applied between the roll and stamp. The fluid pressure may optionally be applied through a porous roll structure. The fluid pressure is then removed allowing the stamp to uniformly come into contact with and adhere to the roll where it remains held by friction or by the work of adhesion. These steps may be repeated as desired to create additional stamps from the same drum.

Figure 2:
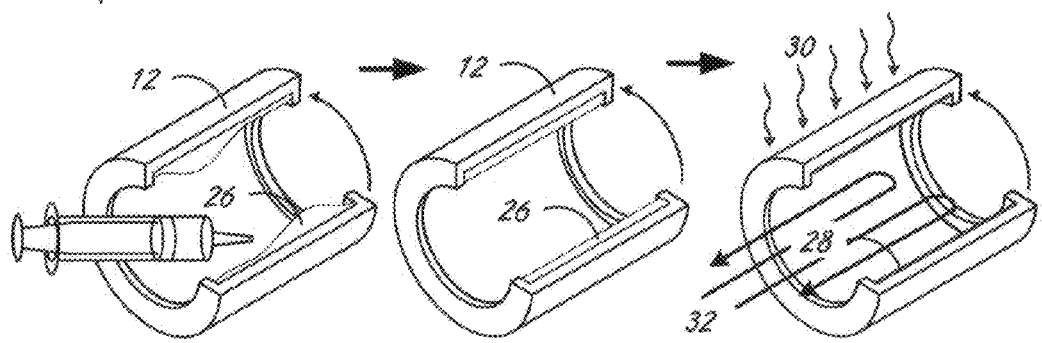
FIG. 2 is a schematic of the fluid coating process of an embodiment of the invention.

Turning to FIG. 2, in the absence of perturbations and for a perfectly leveled axis of rotation, the free surface of the deposited fluid layer will conform to a perfect cylinder about the drum's axis of rotation. When a fluid 26 is introduced to the drum 12, high rotational speeds will force the fluid to a uniform cylindrical surface. At high rotational speeds ω the system is insensitive to gravitational effects from leveling errors. For example, a small angular error of α will induce a taper φ in the free surface of a drum r of $$\phi = \frac{\alpha g}{\omega^2 r}$$

Because $\omega^2 r$ is typically much greater than g (often by a factor of 100 or more), errors in leveling are greatly attenuated (by the same factor of 100 or more). For example, if the axis is leveled within one degree (20 mrad) the free surface would exhibit a taper of only 200 μrad. For example, a stamp 22 with length of 100 mm and thickness of 1 mm may have thickness uniform with 10 μm or within 1 μm.

The rate at which the fluid 26 is forced to a uniform surface is important and should be fast for economical production of stamps. During centrifugal casting, the liquid precursors will quickly centrifuge to an approximately uniform layer. Once any remaining asperities are much smaller than the characteristic layer thickness, the problem can be analyzed assuming fully developed flow and applying the Navier-Stokes equations. Such an analysis shows that asperities decay exponentially with a time constant of $$\tau = \frac{3}{4\pi^2} \cdot \frac{\mu}{\rho} \cdot \frac{\lambda^2}{rh^3} \cdot \frac{1}{\omega^2}$$

where μ is the fluid viscosity, ρ is the fluid density, h is the mean height of the fluid layer, r is the drum radius, ω is the rotational speed of the drum, and λ is the asperity wavelength. For PDMS precursor and reasonable dimensions and velocities, this time constant is on the order of ten seconds. This short time constant allows rapid (within minutes) equalization of the fluid free surface to sub-micron uniformity. Moreover, this time constant is long enough that high frequency noise (bearing effects, periodic gravitational effects with frequency ω, etc.) is attenuated, but short enough that equilibrium can be reached within a reasonable amount of time.

In very thin layers of fluid 26, it may be necessary to dilute the fluid with a solvent to decrease time constant τ by decreasing viscosity μ and increasing thickness h. As shown in FIG. 2, the solvent can be evaporated to leave a layer of solids 28 by optionally applying heat 30 or forced convection 32. For photoresist the solvent may be any solvent well known to the field for photoresist processing. For PDMS the solvent may be an organic solvent, for example hexane.

The first step of depositing a photoresist layer 16 is paramount to obtaining a uniform stamp thickness. This process creates an ideal cylindrical surface that is replicated by the outer diameter of the cast PDMS. Because the inner diameter of the PDMS is also a cylindrical free surface, stamps with thickness variations less than 10 μm or less than 1 μm can be achieved with surface roughness lower than 50 nm or lower than 10 nm.

Figure 3:
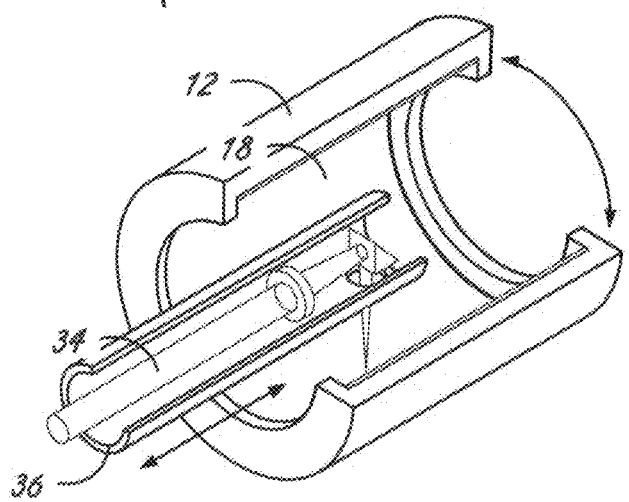
FIG. 3 is a schematic of the direct write aspect of an embodiment of the invention.

Turning to FIG. 3, in the preferred embodiment the second layer of photoresist 18 is selectively patterned using a laser beam 34. In the preferred embodiment, a set of optics 36 is located longitudinally relative to the centrifuge drum 12 to focus and direct the laser beam 34 towards the layer of photoresist 18. The entire inner diameter of the drum can be patterned by rotating the drum 12 and translating the optics 36 longitudinally.

The thickness of the final solids layer 28 in the rotating drum 12 can be controlled by several means. First, unlike common spin coating, mass is conserved within the drum 12. This fact allows thickness to be controlled by precisely metering the amount of fluid 26 introduced into the drum 12. Second, a rim 14 can be placed on the drum 12 which allows fluid layers that exceed the rim to escape the drum during spinning. In this approach, an excess of fluid is added to the drum and allowed to expel until the fluid layer is exactly at the level of the rim. For multiple fluid layers, as discussed above, a series of rims with intermediate wells can optionally be used to control multiple thicknesses.

Figure 4:
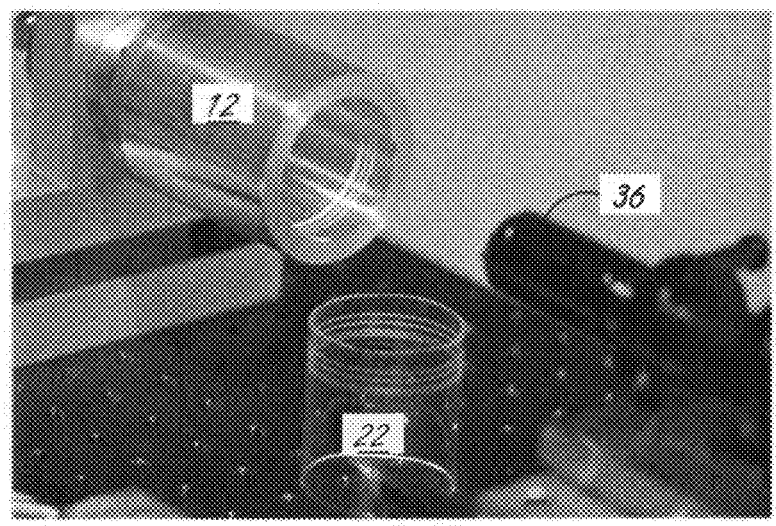
FIG. 4 is a perspective view of an experimental set-up for practicing the invention.
Figure 5:
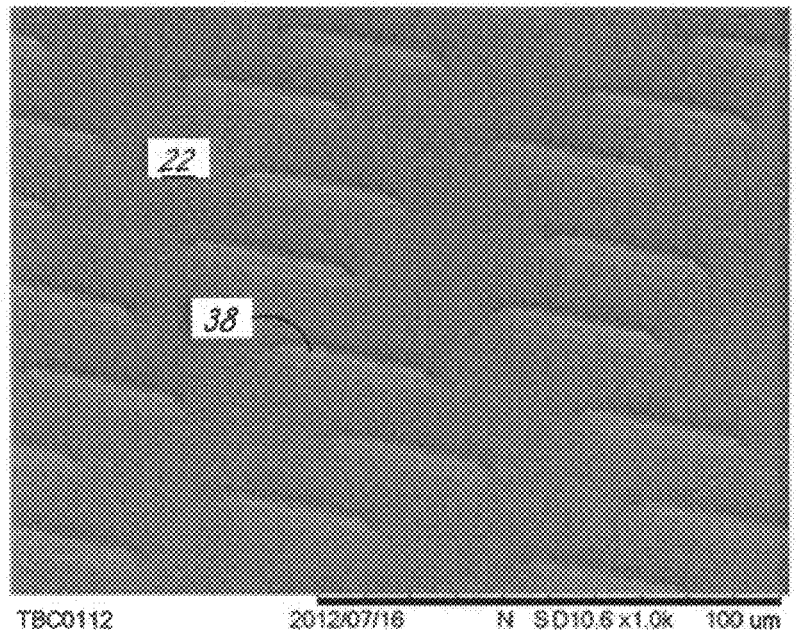
FIG. 5 is a micrograph of features created on the surface of a seamless PDMS stamp created by the centrifugal casting method according to the invention.
Figure 6:
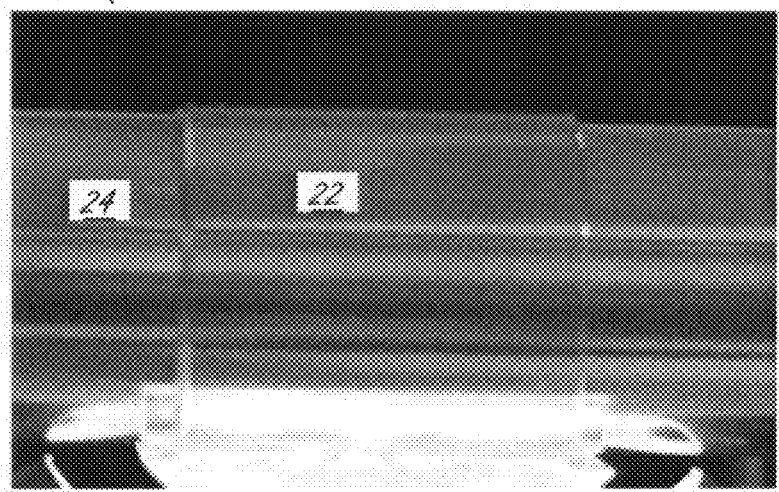
FIG. 6 is a photograph of a centrifuge apparatus and corresponding seamless PDMS stamp representing the preferred embodiment of the invention.

The method according to the invention disclosed herein has been demonstrated. With reference now to FIG. 4, an aluminum drum 12 was mounted on a spindle and driven by a servo motor. Layers of photoresist and PDMS were coated inside the drum as described herein. A laser and optics 36 were used to pattern the inner diameter of the drum 12, replicated in the stamp 22. As shown in FIG. 5, the stamp 22 was molded with millions of small microfeatures 38 that can be used to transfer a printed pattern.

Turning to FIG. 5, the resulting PDMS shell or stamp 22 was applied to a roll 24 by flooding the stamp with ethanol, allowing it to slip along the roll. Once positioned, the stream of ethanol was removed and the stamp allowed to adhere to the roll 24. Alternatively, and for more precise control, a porous drum (e.g., a series of small holes drilled) could have ethanol or a gaseous medium forced through it to create a fluid bearing between the stamp and roll.

The present invention has transformative implications to the soft lithography field, including, but not limited to, microcontact printing and nanoimprint lithography. Several industries would be highly interested in continuous stamps with precise dimensional control. For example, the invention may be used with respect to photovoltaics and displays. Transparent front electrodes are currently made from ITO. ITO has several disadvantages resulting in widespread interest in finding replacements. Among alternatives, including stochastic carbon nanotube (CNT) arrays, conductive polymers, and stochastic metallic nanowire assays, regularly patterned metallic nanowire grids have the lowest (best) sheet resistance. The continuous stamp made according to the method of the invention permits creating electrically conductive nanowire patterns over huge areas at low cost, making metallic nanowire grids a viable option from a manufacturing standpoint.

The invention will also have application with respect to flexible electronics. In a roll-based configuration, microcontact printing can be used to print electronics on flexible substrates in a continuous and high speed fashion thereby creating new opportunities for low cost sensors, displays, RFID tags, etc.

The method of the invention may be also used for creating engineered surfaces. Advances in surface science are demonstrating that significant gains can be realized with metasurfaces, where particular microscale or nanoscale patterns can greatly increase heat transfer rates, charge capture, fouling properties, or condensation behavior. These applications have widespread applications, including conventional power generation, energy storage, desalination, and solar power technologies. The continuous stamp made according to the invention allows creating regular patterns over huge areas with no discontinuity in features.

It is recognized that modifications and variations of the invention disclosed herein will be apparent to those of ordinary skill in the art and it is intended that all such modifications and variations be included within the scope of the appended claims.

The numbers in brackets refer to the references listed herein. These references are incorporated herein by reference.

REFERENCES

[1] Petrzelka J. E., and Hardt D. E., 2011, "Continuous Contact Control for Microcontact Printing using Precision Position Stage with Optical Feedback," ASPE Annual Meeting, Denver, Colo.
[2] Kendale A. M., 2002, "Automation of soft lithographic microcontact printing," Massachusetts Institute of Technology.
[3] Chandekar a, Alabran M., Sengupta S., Lee J., Mead J., Barry C., Whitten J., Somu S., and Busnaina a, 2008, "Fabrication of stamps for microcontact printing by injection molding," Microelectronic Engineering, 85(1), pp. 187-194.
[4] Hougham G., Fryer P., Nunes R., and Rothwell M. B., 2002, "Process of fabricating a precision microcontact printing stamp," U.S. Pat. No. 6,656,308.
[5] Hougham G., Fryer P., Nunes R., and Rothwell M. B., 2002, "Process of fabricating a precision microcontact printing stamp," U.S. Pat. No. 6,783,717.
[6] Cracauer R. F., Ganske R., Goh M. C., Goh J. B., Liederman A. B., Loo R., and Tam P., 2006, "Method and apparatus for micro-contact printing," U.S. Pat. No. 6,981,445.
[7] Datar C. A., 2009, "Design and Development of High Precision Elastomeric-Stamp Wrapping System for Roll-to-Roll Multi-Layer Microcontact Printing," Massachusetts Institute of Technology.
[8] Stagnaro A., 2008, "Design and development of a roll-to-roll machine for continuous high-speed microcontact printing," Massachusetts Institute of Technology.
[9] Petrzelka J. E., and Hardt D. E., 2011, "Limitations on roll based microcontact printing imposed by variations in macro scale stamp dimensions," 2011 MRS Fall Meeting.

What is claimed is:

1. Method for casting a continuous cylindrical polymer stamp comprising:
   depositing a first layer of fluid polymer on the inside of a rotatable drum and rotating the drum for a selected time and at a selected angular velocity;
   curing the polymer to produce a uniform datum surface with thickness variation less than 10 μm;
   depositing a second layer of polymer on the first layer in the drum and rotating the drum until a solvent in the polymer has evaporated thereby forming a cured layer;
   selectively exposing the polymer in the second layer and developing the polymer to create a desired pattern to form a patterned second layer;
   depositing a polymer precursor on the patterned second layer and allowing the polymer precursor to be cured while the drum is rotating to produce a continuous cylindrical polymer stamp; and
   removing the continuous cylindrical polymer stamp from the drum.

2. The method of claim 1 further including positioning, the stamp on a roll using fluid pressure so that the stamp comes into contact with the roll.

3. The method of claim 1 wherein the fluid polymer is photoresist.

4. The method of claim 3 wherein the photoresist is selectively exposed by direct write laser, projection lithography, e-beam lithography, or step and repeat nanoimprint lithography.

5. The method of claim wherein the polymer precursor is polydimethylsiloxane (PDMS) precursor.

6. The method of claim 5 wherein the PDMS precursor is cured by heating the drum.

7. The method of claim 2 wherein the roll is a porous roll and the fluid pressure is applied through the porous roll.

* * * * *